United States Patent [19]

Pollard et al.

[11] 4,439,912

[45] Apr. 3, 1984

[54] INFRARED DETECTOR AND METHOD OF MAKING SAME

[75] Inventors: John H. Pollard; John B. Ramsey, Jr., both of Alexandria, Va.

[73] Assignee: The United States of America as represented by the Secretary of the Army, Washington, D.C.

[21] Appl. No.: 369,774

[22] Filed: Apr. 19, 1982

[51] Int. Cl.$^3$ ............................................. H01L 31/18
[52] U.S. Cl. .................................. 29/572; 29/576 E; 148/1.5; 357/30; 357/71
[58] Field of Search .................... 29/572, 578, 576 E, 29/569 L; 148/1.5; 357/30, 71, 15

[56] References Cited

U.S. PATENT DOCUMENTS

| | | | |
|---|---|---|---|
| 4,037,311 | 7/1977 | Blackman et al. | 29/572 X |
| 4,096,510 | 6/1978 | Arai et al. | 357/71 X |
| 4,142,925 | 3/1979 | King et al. | 29/572 X |
| 4,197,551 | 4/1980 | Adlerstein | 357/15 |
| 4,301,591 | 11/1981 | Withers | 29/572 |
| 4,316,201 | 2/1982 | Christou et al. | 357/71 X |
| 4,318,217 | 3/1982 | Jenner et al. | 29/572 |
| 4,354,198 | 10/1982 | Hodgson et al. | 357/30 X |

OTHER PUBLICATIONS

Mizuishi et al., "Degradation Mechanism of GaAs MESFET's", IEEE Trans. Elec. Dev., vol. 26, #7, Jul. 1979, pp. 1008–1014.

*Primary Examiner*—Brian E. Hearn
*Assistant Examiner*—David A. Hey
*Attorney, Agent, or Firm*—Milton W. Lee; Anthony T. Lane; Aubrey J. Dunn

[57] ABSTRACT

A mercury-cadmium-telluride (HgCdTe) epitaxial detector array is formed on a cadmium telluride (CdTe) substrate. Connecting leads to the detectors are a molybdenum layer covered by a gold-germanium layer. These leads have excellent matches for the thermal coefficients of expansion of the HgCdTe and CdTe and provide ohmic contacts such that the D* of the array is greater than that of arrays made by prior processes using known lead materials, and the noise level is reduced by a factor of approximately three.

2 Claims, 3 Drawing Figures

INFRARED DETECTOR AND METHOD OF MAKING SAME

The invention described herein may be manufactured, used and licensed by the U.S. Government for governmental purposes without the payment of any royalites thereon.

BACKGROUND OF THE INVENTION

This invention is in the field of infrared detectors. Detectors currently of interest are those of HgCdTe (mercury-cadmium-telluride) on CdTe (cadmium-telluride) substrates. These detector materials are formed from liquid phase epitaxial materials and are intended to be used at 77° K. The usual materials for the electrical connectors to the detectors are metals such as indium, gold, platinum, or combination or alloys of the metals. Unfortunately, these metals have coefficients of thermal expansion different from HgCdTe and CdTe and can cause stress in the material upon cooling to its operational temperature. The instant invention avoids this problem and yields some desirable and unexpected results.

SUMMARY OF THE INVENTON

The invention is an improved infrared detector whereby the connecting leads to the detector are successive layers of molybdenum and gold-germanium instead of the usual combination of indium and gold or of gold, chromium, platiunum or indium alone. The method includes the steps of forming the detector and depositing the layers.

DESCRIPTION OF PREFERRED EMBODIMENTS

Figure 1:
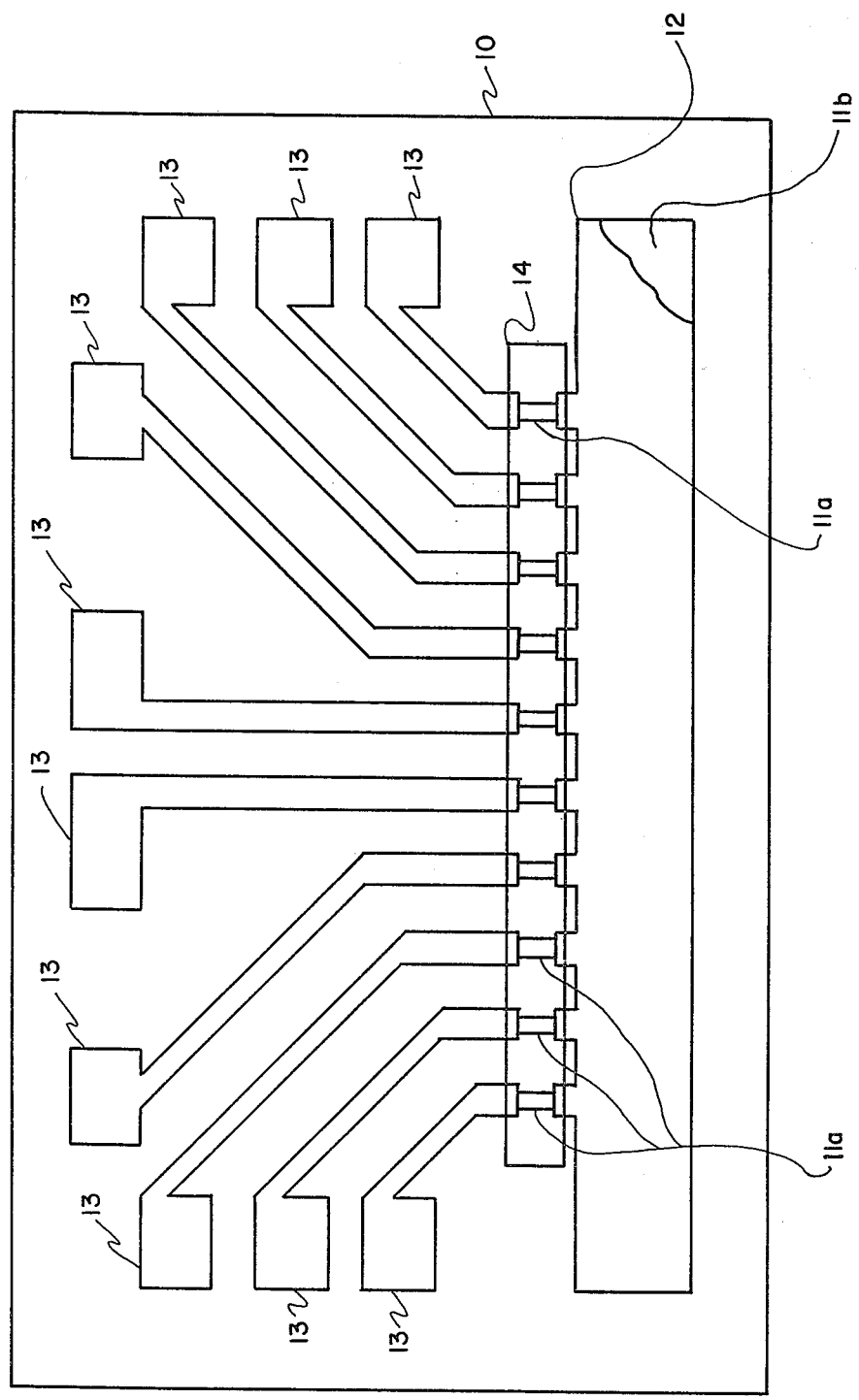
FIG. 1 is a top view, partly cut away, of an array of inventive detectors.

The invention may be best understood when this description is taken in conjunction with the drawings, in which FIG. 1 shows CdTe substrate 10 atop which a layer of HgCdTe was deposited. After the steps of the inventive method are performed, a generally comb-shaped region of HgCdTe remaines on 10 and defines an array of detectors. This region includes detecting regions 11a which are the teeth of the comb and region 11b which is the back of the comb. Overlaying 11b is common conductor 12. Individual detector conductors 13 are connected to detector regions 11a. Passivating and antireflection layer 14 covers detector regions 11a and the region of 10 between these detectors.

Figure 2:
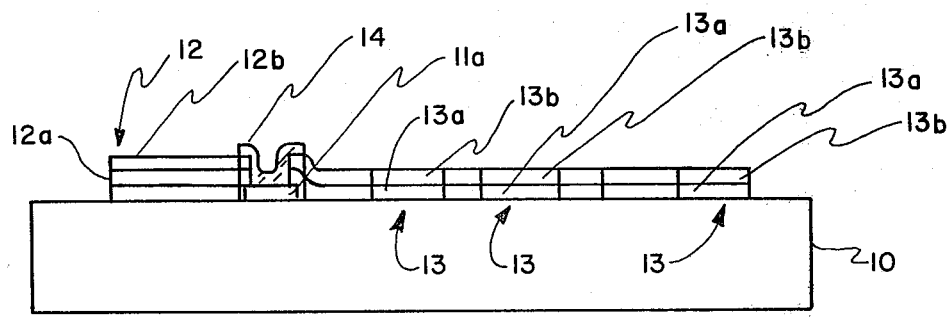
FIG. 2 is an end view of the array.

More detail of the various layers of FIG. 1 can be seen in FIG. 2, The thicknesses of the layers are not to scale, but are exaggerated for purposes of illustration. As can be seen, each of conductors 12 and 13 consists of two layers. Layers 12a and 13a are Mo, and layers 12b and 13b are Au or Au-Ge. Molybdenum was initially chosen because of its better match of coefficient of thermal expansion to that of HgCdTe than the previously used conductor materials. These previously used materials included: In, successive layers of In and Au or In-Au alloys, Pt; these layers have the disadvantage that they tend to cause stress at cryogenic temperatures, whereas Mo does not. The instant invention uses Au or Au-Ge atop Mo to provide good electrical connection with bonding leads (which are usually Au). The use of Mo and Au layers yielded an unexpected result: the detector arrays using these conductors have a greater D* than those arrays using prior art metals, probably because of the fact that the detector-conductor joints form stress-free ohmic connections. Our experiments have shown that photoconductive devices having contacts fabricated by this technique exhibit a reduction in noise, compared to AuIn or In contacts, by a factor of approximately three. There is no reason to believe that this technique would not also be applicable to photovoltaic devices as well.

INVENTION METHOD

Figure 3:
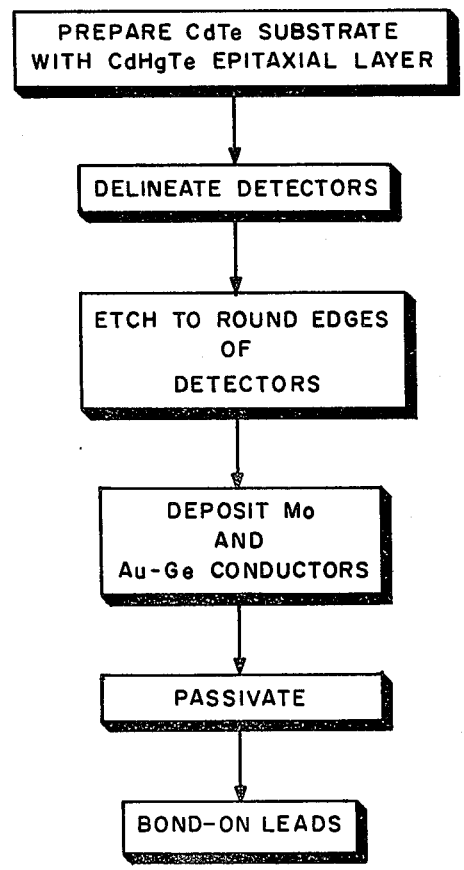
FIG. 3 is a flow chart of the inventive method.

The flow chart of the inventive method as shown in FIG. 3 shows only six steps. However, it should be understood that each of these steps may include several steps, as will be explained later. The first step of the method is preparing an epitaxial HgCdTe layer on a CdTe substrate. The usual way of performing this step uses liquid epitaxial growth, is well known in the art, and the particular way is not critical or essential to the invention method. For ease of handling, we cement the substrate to a chip of sapphire. The next step: "delineate detectors" is where our invention truly begins. Before beginning the description of the various steps within this step, it might be useful to mention that when the HgCdTe is deposited on the CdTe substrate a conductive layer is formed between the two. When the detectors are formed, it is necessary to etch below this layer to avoid shorting between or crosstalk between individual detectors. The delineate detectors step proceeds as follows: deposit a photoresist on the HgCdTe by a usual method such as spinning; mask the photoresist; expose the photoresist through the mask; remove the mask and develop the photoresist; and ion beam or chemically etch away the exposed epitaxial (HgCdTe) layer to define the detectors. The etching is halted periodically and an ohmmeter with point contacts is applied to the eteched region to determine if the semiinsulating CdTe layer has been reached. When it is reached, etching is stopped and the photoresist is removed. A generally comb-shaped epitaxial layer of HgCdTe is left atop the CdTe substrate. The next step in the process is a light chemical etch of the delineated detectors to round their edges or corners. This allows more uniform distribution of the photoresist over the detector regions and gives better lift-off results for the metal conductive layers. The next step: "make conductive leads" begins with essentially the same steps as the delineation step, i.e., deposit, mask, expose, and develop a photoresist. The chip carrying the substrate and comb-shaped epitaxial layer, with photoresist on a portion of each tooth of the comb where the detecting regions will be, is placed in an air-tight housing (vacuum chamber), the air is pumped from the housing and an ion beam is used to clean (by ion milling) the exposed regions of the substrate and epitaxial layer. While the ion milling is proceeding, sputtering of the Mo conductive layer is begun. The ion milling is then halted and Mo is deposited to the desired thickness. When this thickness is obtained, sputtering is halted and ion milling is restarted. With ion milling continuing, Au or Au-Ge sputtering commences. Ion milling then halts and Au or Au-Ge is deposited to the desired thickness. When the desired thickness is reached, sputtering is halted, and the mask and its overlying Mo and Au or Au-Ge layers are removed, this step of removal being known in the art as "lift-off." The conductors then appear as shown by 12 and 13 of FIG. 1. The two final steps of the method are passivation and bonding on of leads. The passivate step begins outside the vacuum chamber with the steps of masking, etc. such that detector regions (and some of the ends of the connectors to the regions) and (if a mask with a single slot is used) the regions on the substrate between the detector regions are exposed. The chip is again placed in the vacuum chamber, and vacuum is pumped to $10^{-6}$ torr. With pumping continuing, $O_2$ is bled in and the substrate and epitaxial layer are ion-mill cleaned; with the ion beam still operating, ZnS sputtering is started. The ion beam and the $O_2$ are then turned off. Sputtering of the ZnS is continued until a thickness of ¼ wavelength of the infrared radiation to be detected is reached. The ZnS thus acts both as a passivation layer and as an antireflection layer. The chip is removed from the vacuum chamber and the mask is stripped. The detector assembly (array) thus produced is now ready for the final step of the process—bonding on of leads. This is done in the usual manner using gold bonding leads thermocompression bonded or the like to conductors 12 and 13.

Specific details of some of the steps are as follows: in the steps of making the conductive leads and of passivating, the ion beam cleaning is argon ions and continues for 15-20 sec. (except after the Mo sputtering) at 500 volts and with a current density of 0.1-0.2 ma/cm$^2$. The thickness of the Mo layer is approximately 700 Å, deposited about 100 Å/min. at 800 volts, 100 ma, about 1 ma/cm$^2$. Although pure Au may be used, a commercially available alloy of 88% Au and 12% Ge is preferred, since it is more brittle than Au and gives good lift off. The Au-Ge layer is approximately 1300Å deposited in 6 minutes at 800 volts, 100 ma, and 1 ma/cm$^2$. The ZnS is sputtered at 800 volts, 1 ma/cm$^2$ until the desired thickness is reached.

We claim:

1. A method of making an infrared detector including the following steps:
   prepare a semiinsulating substrate with an epitaxial layer atop;
   remove portions of said layer to define at least one detector region;
   chemically etch said region to round the corners thereof;
   form conductive leads on said substrate and said layer thusly:
      mask said substrate and said layer;
      ion clean the unmasked portions of said substrate and said layer;
   while continuing to ion clean, start depositing a molybdenum layer on mask, substrate, and layer;
   stop ion cleaning;
   stop depositing molybedenum when the desired thickness is reached;
   ion clean the molybdenum;
   while continuing to ion clean, start depositing gold-germanium alloy;
   stop ion cleaning;
   stop depositing gold-germanium alloy when the desired thickness is reached;
   lift off mask and overlying molybdenum and gold-germanium alloy;
   passivate the detector region thusly:
      mask all regions of the substrate, the epitaxial layer, and the gold-germanium depositation except for the desired detector active region;
      place the substrate in a gas-tight enclosure and pump a vacuum therein;
      while continuing to vacuum pump, bleed oxygen into the enclosure;
      ion clean the region exposed through the mask;
      while continuing to ion clean, start depositing zinc sulfide;
      stop cleaning, stop oxygen flow;
      stop depositing zinc sulfide when the desired thickness is reached;
      remove from gas-tight enclousre;
      remove mask;
   bond on output leads.

2. A method of fabricating ohmic conductors on HgCdTe/CdTe base materials comprising the steps of:
   preparing the surface of the material upon which the ohmic conductors are to be deposited by rounding any of the corner protrusions of the base material;
   masking the material upon which the conductors are to be deposited in order to carefully control the area and location of the conductors;
   ion milling the unmasked portions of said material fo cleaning purposes;
   begin depositing a molybdenum layer over the entire area, including both the masked and unmasked areas, while continuing to ion clean, and then discontinuing the ion milling as the molybdenum layer is beginning to be deposited;
   continuing to deposit the molybdenum until the desired layer thickness is obtained;
   ion cleaning the surface of the molybdenum;
   begin depositing the desired conductor material while the ion cleaning of the molybdenum surface is in progress;
   stopping the ion cleaning as the deposition of the conductor material begins;
   continuing to deposit the conductor material until the desired thickness is achieved; and
   stripping the mask and overlying conductor material from the resulting device, leaving discrete ohmic conductive areas whereby conductive leads may be attached.

* * * * *